United States Patent
Shinohara (10) Patent No.: US 9,437,647 B2
(45) Date of Patent: Sep. 6, 2016

(54) SOLID-STATE IMAGE CAPTURING APPARATUS, METHOD OF MANUFACTURING THE SAME, AND CAMERA

(71) Applicant: CANON KABUSHIKI KAISHA, Tokyo (JP)

(72) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/635,035

(22) Filed: Mar. 2, 2015

(65) Prior Publication Data

US 2015/0263062 A1    Sep. 17, 2015

(30) Foreign Application Priority Data

Mar. 14, 2014 (JP) ................................. 2014-052431

(51) Int. Cl.
*H01L 27/146* (2006.01)

(52) U.S. Cl.
CPC ..... *H01L 27/14679* (2013.01); *H01L 27/1463* (2013.01); *H01L 27/14612* (2013.01); *H01L 27/14681* (2013.01); *H01L 27/14689* (2013.01)

(58) Field of Classification Search
CPC ...... H04N 3/155; H04N 5/335; H04N 5/378; H04N 5/374; H01L 27/14679; H01L 27/14681; H01L 27/14687; H01L 27/14612; H01L 27/1463; H01L 27/14689; H01L 27/14643; H01L 27/14616; H01L 27/14806
See application file for complete search history.

(56) References Cited

U.S. PATENT DOCUMENTS

| | | |
|---|---|---|
| 4,879,470 A | 11/1989 | Sugawa et al. |
| 4,962,412 A | 10/1990 | Shinohara et al. |
| 5,008,206 A | 4/1991 | Shinohara et al. |
| 5,060,042 A | 10/1991 | Shinohara et al. |
| 5,086,326 A | 2/1992 | Shinohara et al. |
| 5,146,339 A | 9/1992 | Shinohara et al. |
| 5,280,358 A | 1/1994 | Yushiya et al. |
| 6,828,601 B2 | 12/2004 | Shinohara |
| 6,876,019 B2 | 4/2005 | Shinohara |
| 7,250,970 B2 | 7/2007 | Shinohara |
| 7,394,492 B2 | 7/2008 | Shinohara |
| 7,560,754 B2 * | 7/2009 | Abe .................... H01L 27/1463 257/222 |
| 7,741,593 B2 | 6/2010 | Iwata et al. |
| 7,821,551 B2 | 10/2010 | Shinohara |

(Continued)

FOREIGN PATENT DOCUMENTS

| | | |
|---|---|---|
| JP | S63-244771 A | 12/1988 |
| JP | 2005-159150 A | 6/2005 |

*Primary Examiner* — Luong T Nguyen
(74) *Attorney, Agent, or Firm* — Fitzpatrick, Cella, Harper & Scinto (57) ABSTRACT

A solid-state image capturing apparatus, comprising a semiconductor substrate including a first region of a first conductivity type, charge accumulation regions of a second conductivity type, transistors each outputting a signal based on charges accumulated in the charge accumulation region, a second region of the first conductivity type formed in a position deeper than the charge accumulation regions and shallower than the first region so as to be electrically conducted to the first region, whose impurity concentration is higher than that of the first region, and a third region of the second conductivity type formed between the second region and the first region, wherein the second region is formed across a region including two or more transistors in a planar view and supplies a current to each of the two or more transistors.

24 Claims, 5 Drawing Sheets

(56) References Cited

U.S. PATENT DOCUMENTS

| | | |
|---|---|---|
| 7,884,870 B2 | 2/2011 | Shinohara |
| 8,063,966 B2 | 11/2011 | Shinohara |
| 8,139,133 B2 | 3/2012 | Iwane et al. |
| 8,164,668 B2 | 4/2012 | Iida et al. |
| 8,345,137 B2 | 1/2013 | Shinohara et al. |
| 8,350,942 B2 | 1/2013 | Shinohara |
| 8,445,944 B2 * | 5/2013 | Ezaki ................ H01L 27/14603 257/233 |
| 8,471,942 B2 | 6/2013 | Shinohara |
| 8,896,734 B2 | 11/2014 | Shinohara |
| 8,970,769 B2 | 3/2015 | Shinohara et al. |
| 8,982,254 B2 * | 3/2015 | Shoyama .......... H01L 27/14627 348/294 |
| 9,177,980 B2 * | 11/2015 | Sogoh ............... H01L 27/14609 |
| 2005/0116259 A1 | 6/2005 | Komori |
| 2012/0193743 A1 * | 8/2012 | Kawahito ............. G01S 7/4816 257/435 |
| 2014/0151753 A1 * | 6/2014 | Konishi ............ H01L 27/14614 257/222 |

\* cited by examiner

SOLID-STATE IMAGE CAPTURING APPARATUS, METHOD OF MANUFACTURING THE SAME, AND CAMERA

BACKGROUND OF THE INVENTION

1. Field of the Invention

The present invention relates to a solid-state image capturing apparatus, a method of manufacturing the same, and a camera.

2. Description of the Related Art

A solid-state image capturing apparatus includes a pixel region in which a plurality of pixels are arrayed on a semiconductor substrate. Each pixel includes a charge accumulation region which accumulates charges generated by photoelectric conversion and a transistor which outputs a voltage change corresponding to the amount of the charges accumulated in the charge accumulation region. A power supply voltage is supplied to the transistor of each pixel via a contact plug arranged on the semiconductor substrate.

Some of the charges generated by photoelectric conversion (for example, the charges generated in a deep position of the semiconductor substrate) may leak into adjacent pixels. Such a leakage of the charges into the adjacent pixels is also referred to as "crosstalk" and may bring about a color mixture between the adjacent pixels.

SUMMARY OF THE INVENTION

The present invention provides a new technique of supplying a power supply voltage to the transistor of each pixel while preventing crosstalk between the adjacent pixels.

One of the aspects of the present invention provides a solid-state image capturing apparatus, comprising a substrate including a first semiconductor region of a first conductivity type, a plurality of charge accumulation regions of a second conductivity type formed in the semiconductor substrate, a plurality of transistors formed in a semiconductor substrate, each configured to output a signal based on a charge accumulated in corresponding one of the plurality of charge accumulation regions, a second semiconductor region of the first conductivity type formed in a position deeper than the charge accumulation regions of the semiconductor substrate and shallower than the first semiconductor region, electrically conducted to the first semiconductor region, and having an impurity concentration higher than that of the first semiconductor region, and a third semiconductor region of the second conductivity type formed between the second semiconductor region and the first semiconductor region, and receiving a first power supply voltage, wherein the second semiconductor region is formed across a region including two or more transistors of the plurality of transistors in a planar view with respect to an upper surface of the semiconductor substrate, and is configured to supply a current to the two or more transistors upon receiving a second power supply voltage different from the first power supply voltage.

Further features of the present invention will become apparent from the following description of exemplary embodiments with reference to the attached drawings.

DESCRIPTION OF THE EMBODIMENTS

1. First Embodiment

1-1. Example of Arrangement of Pixel

An example of the arrangement of a pixel PX will be described below with reference to FIGS. 1A to 1C.

Figure 1A:
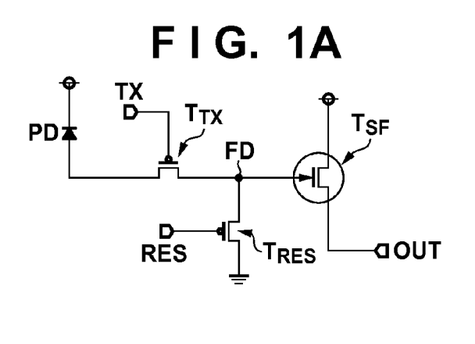
FIGS. 1A to 1C are views for explaining an example of the arrangement of a pixel.

FIG. 1A shows an example of the circuit arrangement of the unit pixel PX. The pixel PX includes a photoelectric conversion portion PD (for example, a photodiode), a transfer transistor $T_{TX}$, a floating diffusion FD, an amplification transistor $T_{SF}$, and a reset transistor $T_{RES}$.

Each of the transfer transistor $T_{TX}$ and the reset transistor $T_{RES}$ is, for example, a p-channel MOS transistor. The amplification transistor $T_{SF}$ is, for example, an n-channel junction field effect transistor (JFET).

The gate terminal of the transfer transistor $T_{TX}$ receives a control signal TX. When the control signal TX is activated, the transfer transistor $T_{TX}$ transfers charges generated upon receiving light in the photoelectric conversion portion PD to the floating diffusion FD. The source potential of the amplification transistor $T_{SF}$ changes depending on fluctuations in the amount of the charges that have been transferred to the floating diffusion FD. A voltage change of an amount corresponding to the amount of the charges is output from an output terminal OUT. Furthermore, the gate terminal of the reset transistor $T_{RES}$ receives a control signal RES. When the control signal RES is activated, the reset transistor $T_{RES}$ resets the potential of the floating diffusion FD.

For the descriptive convenience, the above arrangement has been exemplified as the example of the arrangement of the pixel PX. However, the pixel PX is not limited to the above arrangement. For example, the pixel PX may also include a selection transistor (not shown). The selection transistor can output a pixel signal corresponding to the source potential of the amplification transistor $T_{SF}$ from the output terminal OUT when a control signal supplied to its gate terminal is activated.

Figure 1B:
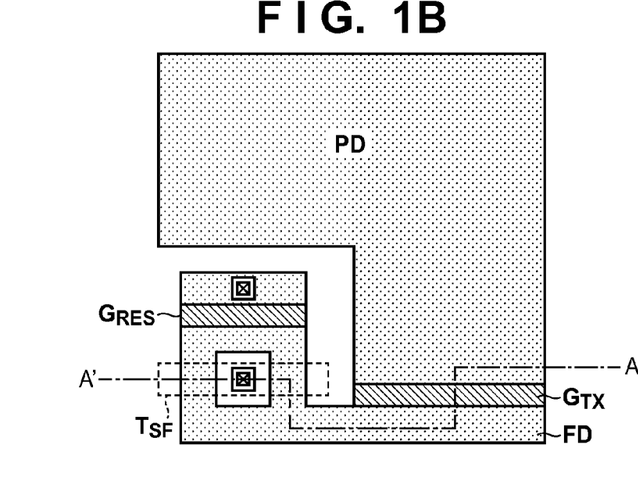

FIG. 1B shows an example of the upper surface layout of the pixel PX. In FIG. 1B, a gate electrode of the reset transistor $T_{RES}$ is denoted by "$G_{TX}$" and a gate electrode of the reset transistor $T_{RES}$ is denoted by "$G_{RES}$". The floating diffusion FD forms the gate region of the amplification transistor $T_{SF}$ as well as the drain regions of the transfer transistor $T_{TX}$ and the reset transistor $T_{RES}$.

Figure 1C:
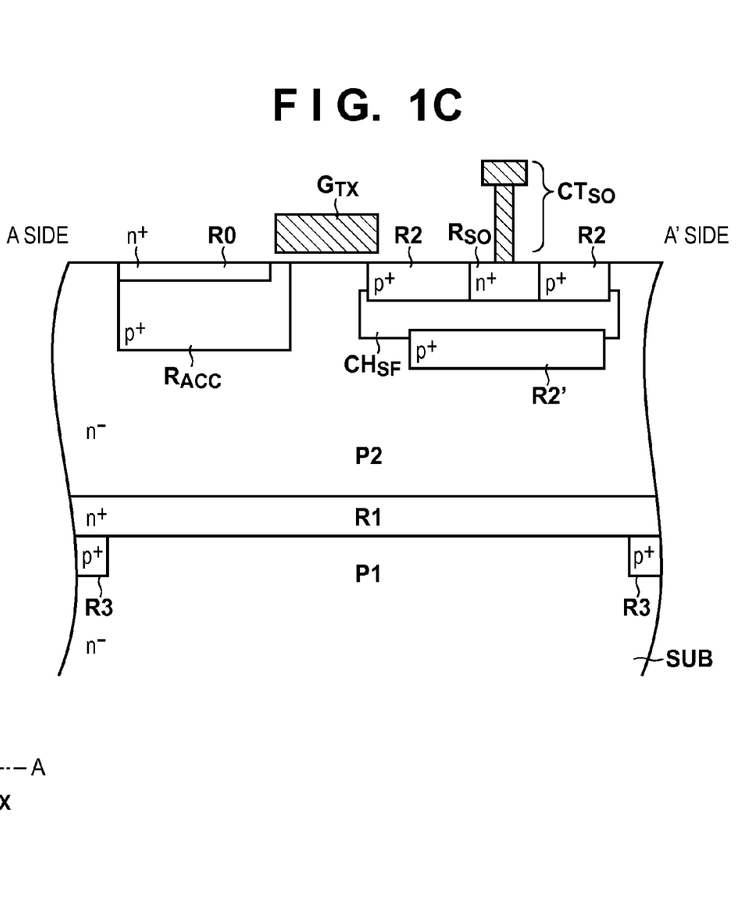

FIG. 1C shows an example of a sectional structure taken along a cut line A-A' in FIG. 1B. Each element (or each portion which forms each element) which forms the pixel PX is formed in, for example, an n-type semiconductor substrate SUB (to be simply referred to as the "substrate SUB" hereinafter).

An n-type semiconductor region R1 is formed in a position of the substrate SUB, deeper than each element and each portion which form the pixel PX. An n-type impurity concentration is higher in the region R1 than in the substrate SUB. In FIG. 1C, out of the substrate SUB, a portion below the region R1 is denoted by "P1" and a portion above the region R1 is denoted by "P2".

A p-type semiconductor region $R_{ACC}$ forms the photoelectric conversion portion PD by a pn junction with the portion P1 and is a charge accumulation region which accumulates charges generated by photoelectric conversion. This arrangement includes a buried type photoelectric conversion portion obtained by forming an n-type semiconductor region R0 in the surface (on the region $R_{ACC}$) of the substrate SUB.

The gate electrode $G_{TX}$ of the transfer transistor $T_{TX}$ transfers the charges in the region $R_{ACC}$ to p-type semiconductor region R2. The region R2 acts as the aforementioned floating diffusion FD and also acts as the gate of the amplification transistor $T_{SF}$ mentioned above. A p-type semiconductor region R2' is electrically connected to the above-described region R2 and acts as the gate of the amplification transistor $T_{SF}$ together with the region R2.

An n-type semiconductor region $R_{SO}$ is the source region of the amplification transistor $T_{SF}$ and a channel region $CH_{SF}$ is the channel region (n type) of the amplification transistor $T_{SF}$. The substrate SUB entirely receives a potential by a power supply voltage and acts as the drain region of the amplification transistor $T_{SF}$.

In the regions R2 and R2' (sometimes to be simply referred to as the "region R2 and the like" hereinafter), a potential fluctuates based on the amount of the charges from the region $R_{ACC}$. The width of a depletion layer between the channel region $CH_{SF}$ and the region R2 and the like changes based on the potential. With this arrangement, the channel width of the amplification transistor $T_{SF}$ is controlled, and a signal potential having a value according to the potential of the region R2 and the like is output from the region $R_{SO}$ via a contact plug $CT_{SO}$.

The region R1 has the n-type impurity concentration higher than that of the substrate SUB and functions as a potential barrier against a minority carrier. This allows the region R1 to prevent the minority carrier generated in a deep position (here, the portion P1) of the substrate SUB from leaking into adjacent pixels (that is, crosstalk between the adjacent pixels).

A p-type semiconductor region R3 may be formed below the region R1. The region R3 is formed, for example, between the adjacent pixels. An electric field from the region R3 guides, to the region R3, the minority carrier generated in the deep position (portion P1) of the substrate SUB by photoelectric conversion. Therefore, this structure can prevent the crosstalk between the adjacent pixels.

This arrangement has exemplified the case in which the amplification transistor $T_{SF}$ is the JFET. However, the amplification transistor $T_{SF}$ may be a transistor having another structure. The amplification transistor $T_{SF}$ may be, for example, a bipolar transistor or a static induction transistor (SIT). Also, the amplification transistor $T_{SF}$ may be a MOS transistor. For example, a buried channel MOS transistor, a three-dimensional vertical MOS transistor, or the like can preferably be used as the amplification transistor $T_{SF}$. Even in these structures, the semiconductor region R2 also acts as a control unit (a base or a gate) which controls the current amount of the amplification transistor $T_{SF}$.

The arrangement in which each element and each portion which form the pixel PX are formed in the n-type substrate SUB has been exemplified here. However, the conductivity type of the substrate SUB or each semiconductor region may be reversed and the polarity of each element may be reversed. That is, the arrangement of the pixel PX may read out, out of an electron-hole pair generated by photoelectric conversion, a signal based on an electron or a signal based on a hole. An impurity such as boron can be used to form a p-type semiconductor region. On the other hand, an impurity such as phosphorus or arsenic can be used to form an n-type semiconductor region.

The structure in which each element and each portion which form the pixel PX are formed in the substrate SUB has been exemplified here. However, the present invention is not limited to this structure. Each element and each portion may be formed, for example, in a well formed in the substrate SUB or in an epitaxial growth layer formed in the substrate SUB, or may be formed in a predetermined semiconductor region or semiconductor portion.

1-2. Example of Structure of Solid-State Image Capturing Apparatus

Figure 2:
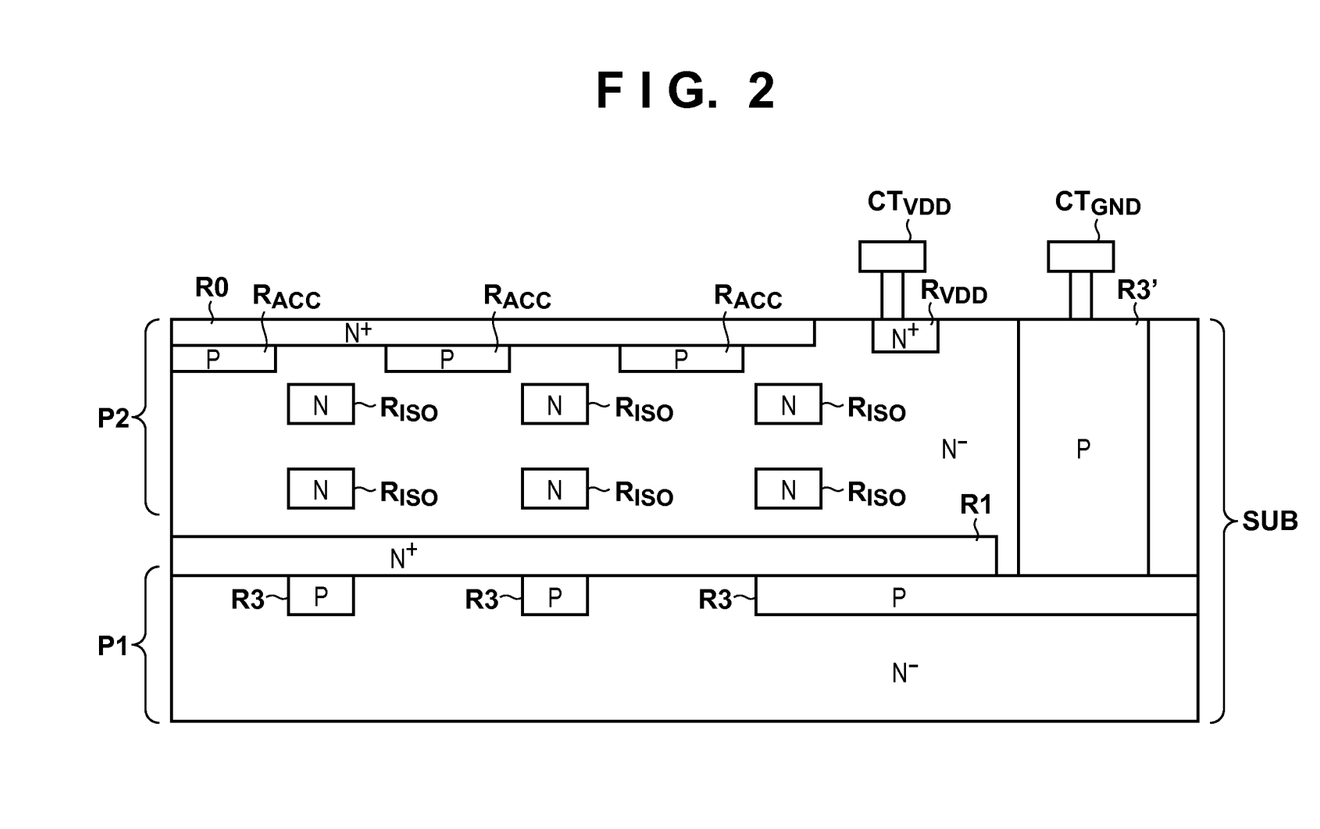
FIG. 2 is a view for explaining an example of the structure of a solid-state image capturing apparatus.

An example of the structure of a solid-state image capturing apparatus (to be referred to as a "solid-state image capturing apparatus I") will be described below with reference to FIG. 2. The solid-state image capturing apparatus I includes the plurality of pixels PX. For the descriptive convenience, FIG. 2 shows an example of a sectional structure in a region of three pixels PX. Similarly, for the descriptive convenience, FIG. 2 does not show the transistor $T_{TX}$ and the like. That is, FIG. 2 shows the charge accumulation region $R_{ACC}$ of each pixel PX, the region R0 formed across the plurality of pixels PX, the region R1 formed in the deep position of the substrate SUB, and the region R3 formed below the region R1.

Element isolation regions $R_{ISO}$ are formed between the adjacent pixels, here, between the charge accumulation region $R_{ACC}$ of a certain pixel and the charge accumulation region $R_{ACC}$ of a pixel adjacent to the pixel. Each region $R_{ISO}$ is the n-type semiconductor region having the n-type impurity concentration higher than that of the substrate SUB. This structure can prevent crosstalk between the adjacent pixels that has been caused by a minority carrier generated in a shallow position (portion P2) of the substrate SUB by photoelectric conversion.

For example, contact plugs $CT_{GND}$ and $CT_{VDD}$ configured to supply a power supply voltage are arranged in a part of a pixel region so as to correspond to a predetermined number (two or more) of pixels PX. The pair of contact plugs $CT_{GND}$ and $CT_{VDD}$ can be arranged every predetermined region of, for example, 8 rows×8 columns or 16 rows×16 columns. The contact plug $CT_{GND}$ is electrically connected to a region R3' formed from the regions R3 to the surface of the substrate SUB so as to contact the regions R3, and grounds the regions R3 (supplies 0 [V] to the regions R3). The contact plug $CT_{VDD}$ supplies, via an n-type semiconductor region $R_{VDD}$, a power supply voltage (to be referred to as a "power supply voltage VDD") to the entire substrate SUB (the n-type semiconductor regions such as the portions P1 and P2, and the regions R1 and $R_{ISO}$).

The region R1 can be formed at the impurity concentration higher than that of the substrate SUB and also at the impurity concentration which is high enough to avoid a completely depleted state. The region R1 is formed across the plurality of pixels PX in a position at a predetermined depth of the substrate SUB, and reduces a voltage drop caused by substrate resistance when a current flows to the amplification transistor $T_{SF}$ and reduces a potential difference between the pixels on the substrate SUB. In addition, as described above, the region R1 can also function as the potential barrier against the minority carrier generated in the deep position (portion P1) of the substrate SUB and prevent the crosstalk between the adjacent pixels that has been caused by the minority carrier generated in the deep position.

Although not shown here, an n-type semiconductor region having an impurity concentration higher than that of the substrate SUB may also be formed from the region R1 to the surface (the region $R_{VDD}$) of the substrate SUB so as to contact the region R1.

As described above, the regions R3 can prevent the crosstalk between the adjacent pixels that has been caused by the minority carrier generated in the deep position of the substrate SUB. In a planar view, the regions R3 may be formed in, for example, a lattice-shaped pattern, or in a line or strip-shaped pattern at a predetermined interval (or according to the array of the pixels). In this case, each portion of the regions R3 is preferably formed so as not to contact a depletion layer formed in a boundary portion between the portion P1 of the substrate SUB and each portion of the regions R3. In other words, the regions R3 are preferably formed so as not to electrically isolate the portion P1 and the portion P2 of the substrate SUB from each other (so as to conduct the portion P1 and the portion P2 to each other).

FIG. 2 shows the structure in which the region R1 and the regions R3 are in contact with each other. However, it is only necessary for the regions R3 to be formed in positions deeper than the region R1 and they may not be in contact with each other.

As described above, according to this structure, the n-type semiconductor region R1 is formed across the plurality of pixels PX in the position at the predetermined depth of the substrate SUB. This structure reduces the potential difference between the pixels on the substrate SUB. More specifically, this structure reduces potential fluctuations on the substrate SUB caused by supplying a current corresponding to the amount of the charges accumulated in the charge accumulation region $R_{ACC}$ to the amplification transistor $T_{SF}$ which outputs the current. The region R1 functions as the potential barrier against the minority carrier generated in the deep position (portion P1) of the substrate SUB. Therefore, according to this structure, it is possible to prevent the crosstalk between the adjacent pixels caused by the minority carrier.

The p-type semiconductor regions R3 may be formed below the region R1. A potential serving as a reverse bias to that of the n-type semiconductor region R1 is supplied to each region R3. According to this structure, the minority carrier generated in the deep position of the substrate SUB is guided to each region R3 and an effect of preventing the crosstalk between the adjacent pixels caused by the minority carrier is better than in a structure without the regions R3 (a structure in which the region R1 out of the regions R1 and R3 is formed). The regions R3 may be formed in a lattice-shaped pattern or line at the predetermined interval, or between the adjacent pixels.

Furthermore, the structure in which the element isolation regions $R_{ISO}$ are formed above the region R1 in the portion P2 of the substrate SUB has been exemplified here. However, the regions $R_{ISO}$ may contact the region R1. According to this structure, it is possible to appropriately prevent the potential fluctuations up to the upper side (surface side) of the portion P2 and supply the power supply voltage to the transistor of each pixel while preventing the crosstalk between the adjacent pixels.

1-3. Example of Method of Manufacturing Solid-State Image Capturing Apparatus An example of a method of manufacturing the solid-state image capturing apparatus I will be described below with reference to FIG. 3. The solid-state image capturing apparatus I can be manufactured by a known semiconductor manufacturing technique. An example of a step of forming the n-type semiconductor region R1 and the p-type semiconductor regions R3 will be described here.

Figure 3:
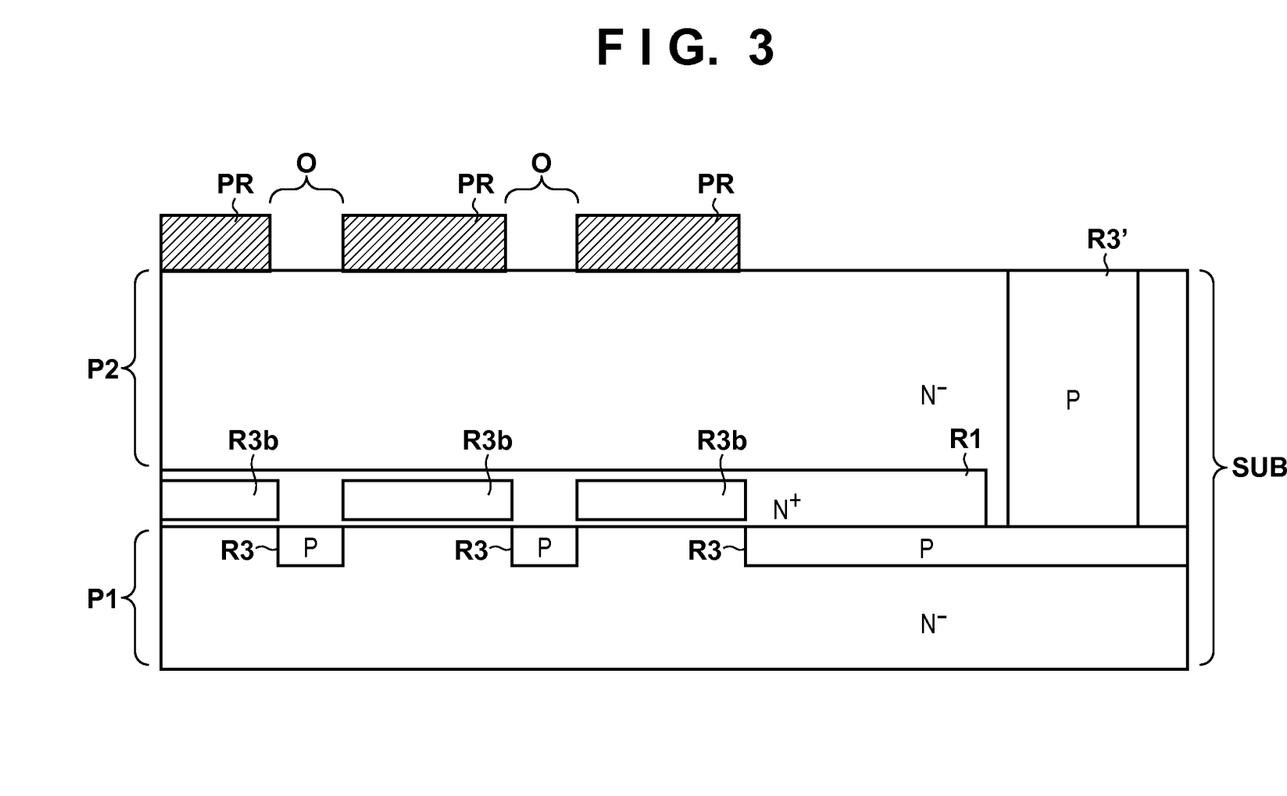
FIG. 3 is a view for explaining an example of a method of manufacturing the solid-state image capturing apparatus.

Each region R3 can be formed by, for example, implanting a p-type impurity via a photoresist pattern having a predetermined opening. In order to form the regions R3 in the deep positions, it is necessary to increase the thickness of the photoresist pattern (for example, increase the thickness to be larger than the depth of each region R3) for forming the regions R3. It is difficult, however, to pattern a photoresist having a large thickness at high accuracy. To cope with this, in this embodiment, the regions R3 are formed first using, for example, a photoresist pattern (to be referred to as a "photoresist pattern PR") having a thickness smaller than that of the above-described photoresist pattern, and then the region R1 is formed.

FIG. 3 shows a state after the region R1 and the regions R3 are formed in the substrate SUB, and before each element and each portion which form the pixel PX in the substrate SUB are formed.

First, the photoresist pattern PR having openings O is formed in the substrate SUB. Then, the p-type impurity is implanted via the photoresist pattern PR. Each region R3 is formed, by the p-type impurity that has passed through the opening O, under the opening O of the photoresist pattern PR. Along with the formation of the regions R3, each p-type impurity region R3b is formed, by the p-type impurity that has passed through the photoresist pattern PR and reduced speed, in a position shallower than the region R3 under the photoresist pattern PR (under a region other than the opening O).

Next, the n-type semiconductor region R1 is formed, by implanting an n-type impurity, in positions where the regions R3b are formed. The n-type impurity concentration in the region R1 is higher than the p-type impurity concentration in each region R3b. As a result, a final conductivity type in the region R1 will be an n type. That is, the region R1 suffices to be formed to set the net concentration of the n-type impurity into positive.

According to the above-described formation method, it is possible to form the region R1 and the regions R3 in the deep positions of the substrate SUB. Note that the formation order of the region R1 and the regions R3 may be reversed, and either of them may be formed first.

2. Second Embodiment

Figure 4:
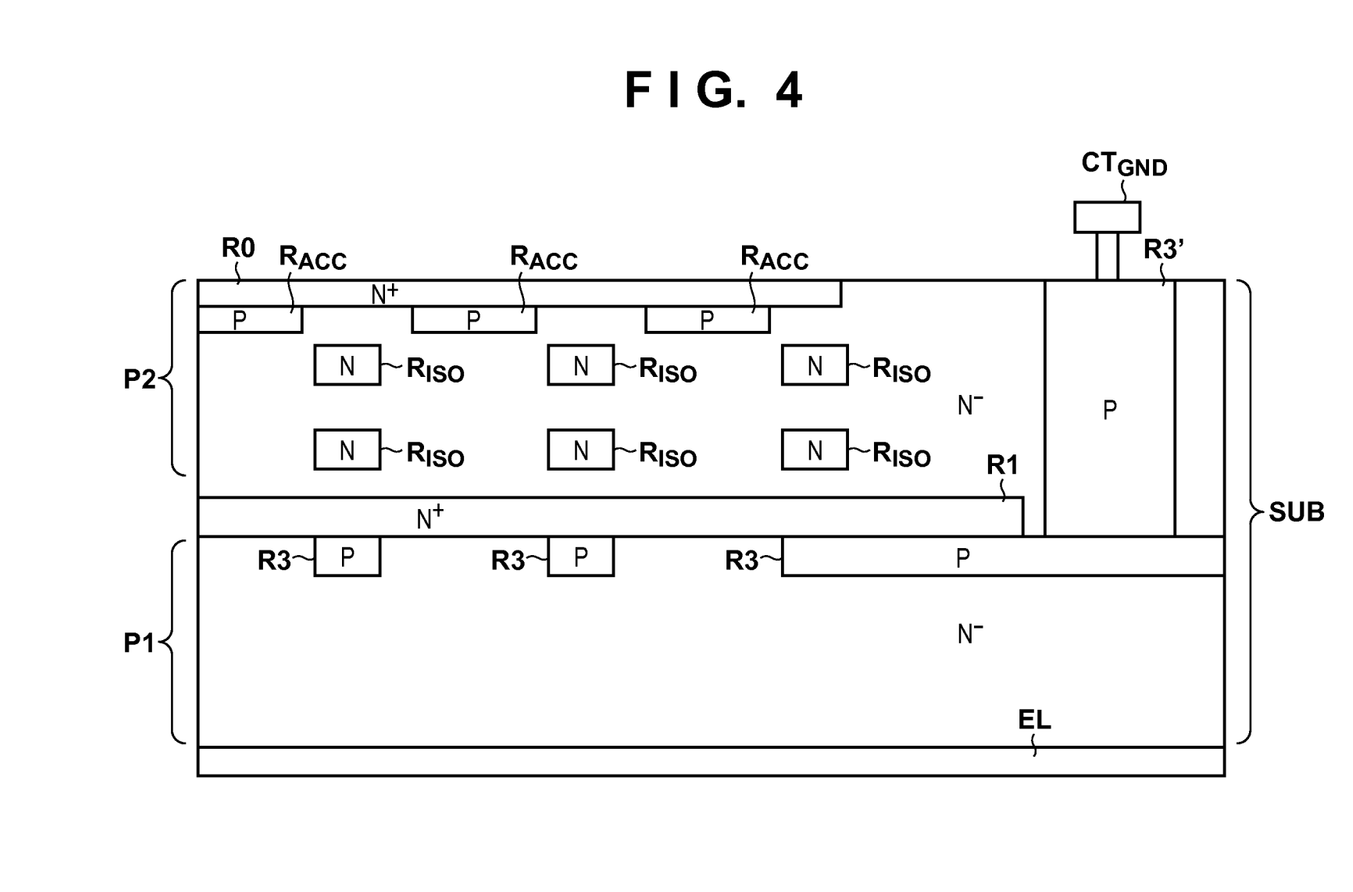
FIG. 4 is a view for explaining an example of the structure of a solid-state image capturing apparatus.

The second embodiment will be described with reference to FIG. 4. This embodiment is different from the first embodiment in that an electrode EL configured to supply a power supply voltage to a substrate SUB is arranged on the back side (the surface opposite to the surface where each element has been formed) of the substrate SUB. In a planar view, the electrode EL is preferably formed across the whole pixel region. Since substrate resistance is reduced in this structure, it is possible to reduce a voltage drop caused by the substrate resistance when a current flows to an amplification transistor $T_{SF}$ and reduce a potential difference between the pixels on the substrate SUB. A structure in which one electrode EL is formed across the whole pixel region has been exemplified here. However, a structure in which a plurality of electrodes are respectively arranged at a plurality of different positions in the pixel region may be employed.

Also in this embodiment, it is possible to further reduce the potential difference between the pixels on the substrate SUB in addition to obtaining the same effect as in the first embodiment.

3. Third Embodiment

Figure 5:
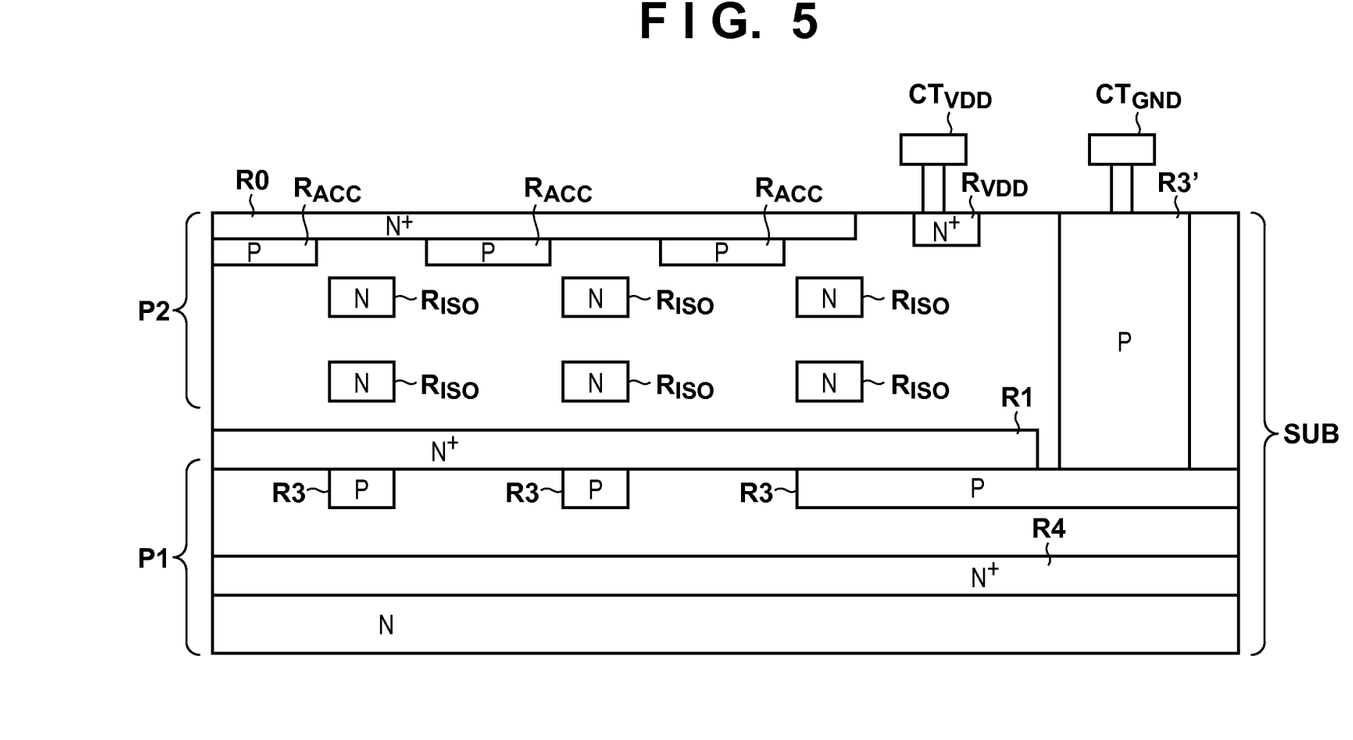
FIG. 5 is a view for explaining an example of the structure of a solid-state image capturing apparatus.

The third embodiment will be described with reference to FIG. 5. This embodiment is different from the first embodiment in that an n-type semiconductor region R4 is formed in a position much deeper than an n-type semiconductor region R1 of a substrate SUB. Similarly to the region R1, the region R4 is formed across a plurality of pixels PX. Furthermore, the region R4 is formed at an n-type impurity concentration higher than that of the substrate SUB and at an impurity concentration which is high enough to avoid a completely depleted state. According to this structure, substrate resistance is reduced, thus further reducing a potential difference between the pixels in the substrate SUB.

The region R4 can be formed in a position deeper than p-type semiconductor regions R3. Also in this structure, a minority carrier generated in a deep position is guided to each region R3 and crosstalk between adjacent pixels is reduced.

Also in this embodiment, it is possible to further reduce the potential difference between the pixels on the substrate SUB in addition to obtaining the same effect as in the first embodiment.

4. Others

The three embodiments have been exemplified above. However, the present invention is not limited to these embodiments. The present invention may change some of the embodiments or combine the respective embodiments in accordance with an application or the like.

Although not shown in the respective embodiments described above, a solid-state image capturing apparatus I can include a structure including a wiring pattern arranged on a substrate SUB and an optical system arranged on the structure. The optical system can include an inner lens and a color filter in addition to a microlens. The color of the color filter is determined based on, for example, a Bayer array. Furthermore, the solid-state image capturing apparatus I may employ a back-side illumination structure in which the optical system is arranged below the substrate SUB.

In the above embodiments, the present invention has been described by exemplifying a solid-state image capturing apparatus included in an image capturing system represented by a camera or the like. The concept of the image capturing system includes not only apparatuses primarily aiming at shooting but also apparatuses (for example, a personal computer and a portable terminal) secondarily having a shooting function. The image capturing system can include the solid-state image capturing apparatus exemplified in the above embodiments, and a processing unit that processes a signal output from the solid-state image capturing apparatus. The processing unit can include, for example, an A/D converter, and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-052431, filed Mar. 14, 2014, which is hereby incorporated by reference herein in its entirety.

What is claimed is:

1. A solid-state image capturing apparatus comprising:
a semiconductor substrate including a first semiconductor region of a first conductivity type;
a plurality of charge accumulation regions of a second conductivity type formed in the semiconductor substrate;
a plurality of transistors formed in a semiconductor substrate, each configured to output a signal based on a charge accumulated in corresponding one of the plurality of charge accumulation regions;
a second semiconductor region of the first conductivity type formed in a position deeper than the plurality of charge accumulation regions of the semiconductor substrate and shallower than the first semiconductor region, electrically conducted to the first semiconductor region, and having an impurity concentration higher than that of the first semiconductor region; and
a third semiconductor region of the second conductivity type formed between the second semiconductor region and the first semiconductor region, and receiving a first power supply voltage,
wherein the second semiconductor region is formed across a region including two or more transistors of the plurality of transistors in a planar view with respect to an upper surface of the semiconductor substrate, and is configured to supply a current to the two or more transistors upon receiving a second power supply voltage different from the first power supply voltage.

2. The apparatus according to claim 1, further comprising a plurality of fourth semiconductor regions of the second conductivity type formed in the semiconductor substrate and receiving a potential corresponding to an amount of charges accumulated in the plurality of charge accumulation regions,
wherein each of the fourth semiconductor regions acts as a control unit configured to control output potentials from the plurality of transistors.

3. The apparatus according to claim 2, wherein the plurality of transistors include a junction field effect transistor, and
each of the fourth semiconductor regions forms a gate of the junction field effect transistor.

4. The apparatus according to claim 2, wherein the plurality of transistors include a static induction transistor, and
each of the fourth semiconductor regions forms a gate of the static induction transistor.

5. The apparatus according to claim 2, wherein the plurality of transistors include a bipolar transistor, and
each of the fourth semiconductor regions forms a base of the bipolar transistor.

6. The apparatus according to claim 2, further comprising a plurality of second transistors formed in the semiconductor substrate and configured to transfer the charges accumulated in the plurality of charge accumulation regions to the fourth semiconductor regions.

7. The apparatus according to claim 1, wherein the third semiconductor region has, in the planar view with respect to the upper surface of the semiconductor substrate, a pattern configured to electrically conduct the first semiconductor region and the second semiconductor region to each other.

8. The apparatus according to claim 1, wherein the third semiconductor region is formed in a lattice-shaped pattern or a strip-shaped pattern in the planar view with respect to the upper surface of the semiconductor substrate.

9. The apparatus according to claim 8, wherein the third semiconductor region in the lattice-shaped pattern is formed so as not to electrically isolate, by a depletion layer formed in a boundary portion between the first semiconductor region and the third semiconductor region, a portion of the first semiconductor region above the third semiconductor region and a portion of the first semiconductor region below the third semiconductor region from each other.

10. The apparatus according to claim 1, further comprising a contact plug configured to supply the first power supply voltage to the third semiconductor region.

11. The apparatus according to claim 10, further comprising a semiconductor region which electrically connects the third semiconductor region and the contact plug.

12. The apparatus according to claim 1, further comprising a fifth semiconductor region of the first conductivity type formed, so as to contact the first semiconductor region, in a position deeper than the third semiconductor region of the semiconductor substrate, at an impurity concentration of the first conductivity type higher than that of the first semiconductor region,
wherein the fifth semiconductor region is formed across a region including the two or more transistors in the planar view with respect to the upper surface of the semiconductor substrate.

13. The apparatus according to claim 1, further comprising a second contact plug configured to supply the second power supply voltage to the first semiconductor region and the second semiconductor region.

14. The apparatus according to claim 13, further comprising a semiconductor region formed at the impurity concentration of the first conductivity type higher than that of the first semiconductor region and configured to electrically connect the second semiconductor region and the second contact plug.

15. The apparatus according to claim 1, further comprising an electrode arranged on a surface opposite to a surface in which the plurality of charge accumulation regions on the semiconductor substrate and the plurality of transistors are formed, and configured to supply the second power supply voltage to the first semiconductor region and the second semiconductor region.

16. The apparatus according to claim 1, further comprising an element isolation region formed in a position shallower than the second semiconductor region of the semiconductor substrate.

17. The apparatus according to claim 16, wherein the element isolation region is a semiconductor region of the first conductivity type formed so as to contact the first semiconductor region.

18. The apparatus according to claim 17, wherein the element isolation region is in contact with the second semiconductor region.

19. A camera comprising:
the solid-state image capturing apparatus defined in claim 1; and
a processing unit configured to process a signal output from the solid-state image capturing apparatus.

20. A method of manufacturing a solid-state image capturing apparatus, comprising steps of:
preparing a semiconductor substrate including a first semiconductor region of a first conductivity type;
forming, in the first semiconductor region, a plurality of charge accumulation regions of a second conductivity type having a polarity different from that of the first conductivity type;
forming, in the first semiconductor region in the semiconductor substrate, a plurality of transistors configured to output a current corresponding to an amount of charges accumulated in the plurality of charge accumulation regions; and
forming a second semiconductor region of the first conductivity type across a region including two or more transistors of the plurality of transistors in a planar view with respect to an upper surface of the semiconductor substrate so as to contact the first semiconductor region, in a position deeper than the plurality of charge accumulation regions of the semiconductor substrate, at an impurity concentration of the first conductivity type higher than that of the first semiconductor region.

21. The method according to claim 20, further comprising a step of forming a third semiconductor region of the second conductivity type so as to contact the first semiconductor region in a position deeper than the second semiconductor region of the semiconductor substrate.

22. The method according to claim 21, wherein the steps of forming the second semiconductor region and the third semiconductor region includes steps of
forming, on the semiconductor substrate, a resist pattern having an opening on the first semiconductor region in the semiconductor substrate,
forming a first region of the second conductivity type in a position shallower than the third semiconductor region in the first semiconductor region while implanting an impurity of the second conductivity type in the first semiconductor region via the resist pattern and forming the third semiconductor region of the second conductivity type under the opening in the first semiconductor region, and
forming the second semiconductor region of the first conductivity type by implanting an impurity of the first conductivity type in a position having the same depth as that of the first region in the first semiconductor region.

23. The method according to claim 22, wherein the first region is a region formed by an impurity of the second conductivity type that has passed through the resist pattern.

24. The method according to claim 20, further comprising a step of forming, in the semiconductor substrate, a plurality of fourth semiconductor regions of the second conductivity type configured to act as a control unit which receives a potential corresponding to an amount of charges accumulated in the plurality of charge accumulation regions and control a current amount of each of the plurality of transistors.

* * * * *